United States Patent [19]
Saitoh et al.

[11] Patent Number: 5,561,313
[45] Date of Patent: Oct. 1, 1996

[54] PROTECTIVE DIODE FOR TRANSISTOR

[75] Inventors: Ryu Saitoh; Masahito Otsuki; Akira Nishiura, all of Nagano, Japan

[73] Assignee: Fuji Electric Co., Ltd., Kawasaki, Japan

[21] Appl. No.: 567,802

[22] Filed: Dec. 6, 1995

Related U.S. Application Data

[63] Continuation of Ser. No. 231,522, Apr. 22, 1994, abandoned.

[30] Foreign Application Priority Data

Apr. 22, 1993 [JP] Japan ................................. 5-094706

[51] Int. Cl.$^6$ ................................. H01L 23/62
[52] U.S. Cl. ................. 257/360; 257/173; 257/328; 257/355; 257/356; 257/362; 257/409; 257/493
[58] Field of Search ................. 257/328, 355, 257/362, 173, 360, 356, 409, 493

[56] References Cited

U.S. PATENT DOCUMENTS

| | | | |
|---|---|---|---|
| 3,789,503 | 2/1974 | Nishida et al. | 29/571 |
| 4,356,502 | 10/1982 | Yamada | 357/13 |
| 4,803,533 | 2/1989 | Chang et al. | 357/23.4 |
| 5,001,529 | 3/1991 | Ohshima et al. | 257/362 |
| 5,045,902 | 9/1991 | Bancal | 257/328 |
| 5,081,509 | 1/1992 | Kozaka et al. | 357/13 |

FOREIGN PATENT DOCUMENTS

| | | | |
|---|---|---|---|
| 0072690 | 2/1983 | European Pat. Off. | H01L 21/90 |
| 0222326 | 5/1987 | European Pat. Off. | H01L 21/265 |
| 0292782 | 11/1988 | European Pat. Off. | H01L 29/78 |
| 0360991 | 4/1990 | European Pat. Off. | H02H 11/00 |
| 0416805 | 3/1991 | European Pat. Off. | H01L 29/06 |
| 0437939 | 7/1991 | European Pat. Off. | H01L 29/784 |
| 0599745 | 6/1994 | European Pat. Off. | H01L 27/02 |
| 2652449 | 3/1991 | France | H01L 23/60 |
| 3540433 | 5/1986 | Germany | H01L 29/78 |
| 57-190359 | 11/1982 | Japan | H01L 29/78 |
| 3-65027 | 10/1991 | Japan . | |
| 3-70907 | 11/1991 | Japan . | |
| 4-332172 | 11/1992 | Japan | H01L 29/784 |

*Primary Examiner*—Edward Wojciechowicz
*Attorney, Agent, or Firm*—Rossi & Associates

[57] ABSTRACT

To reduce the required diffusion depth of impurities in manufacturing a protective diode for protecting an insulated gate transistor from overvoltage so that the diode can be easily built in a chip of the transistor. A plurality of p-type diode layers are built in by diffusion through the windows in an insulation film disposed on an n-type region into which a depletion layers spread when the vertical field effect transistor to be protected is turned off, and a diode terminal A is led out from an electrode film that is in electrical contact with the diode layers. This configuration prevents depletion layers, spreading from the diode layers into the semiconductor region by the applied overvoltage, from joining with each other, and sufficiently lowers the breakdown voltage of the protective diode with respect to the withstand voltage of the transistor 10 or 20 even when the diffusion depth of the diode layer is one order of magnitude shallower than in conventional devices.

6 Claims, 3 Drawing Sheets

PROTECTIVE DIODE FOR TRANSISTOR

This is a Continuation of application Ser. No. 08/231,522 filed Apr. 22, 1994, now abandoned.

FIELD OF THE INVENTION

The present invention relates to a diode built into a chip of a transistor for protecting the transistor from overvoltage. In particular, the invention relates to a protective diode suitable to an insulated gate transistor such as a field-effect transistor (hereinafter referred to as "FET") or an insulated gate bipolar transistor (hereinafter referred to as "IGBT").

When overvoltage is applied to a transistor, while it is driving a load for example, from the load side and a breakdown occurs between the main terminals of the transistor, the transistor may be damaged or destroyed by an excessive avalanche current that flows through the transistor during the breakdown period. To avoid this, a diode is often connected to the transistor that breaks down prior to the break down of the transistor when overvoltage is applied. A scheme of protecting the transistor from such overvoltage is described with reference to FIG. 7, according to a prior art dynamic clamping protection method suitable to an insulated gate transistor.

In FIG. 7(a), an FET 10 is to be protected from overvoltage. A protective diode 30, that breaks down, for example, by overvoltage applied from the load side when a source terminal S side is grounded and a load is connected to a drain source D, is connected between a drain and a gate terminal G in reverse polarity to a supplementary diode 50. When the FET 10 is turned off and the overvoltage caused by the induction or the like on the load side reaches the breakdown voltage of the protective diode 30 lower than the breakdown voltage value of the FET 10, the protective diode 30 becomes conductive to increase the gate voltage of the n-channel FET 10, which then stays in an "ON" state. Consequently, the overvoltage is clamped at the break down voltage of the protective diode 30. When the transient overvoltage decreases, the protective diode 30 returns to a non-breakdown state to turn off the FET 10. The supplementary diode 50 is used to prevent the protective diode 30 from becoming conductive by positive gate voltage when the FET 10 is turned on.

In FIG. 7(b), an IGBT 20 is an object to be protected. In this case, the protective diode 30 is connected between the base of the IGBT 20 and the gate terminal G without using the supplementary diode 50 in FIG. 7(a). When, for example, overvoltage is applied to a collector terminal C, connected to a load, of the "OFF" state IGBT 20 the emitter terminal of which is grounded, the protective diode 30 breaks down to clamp the voltage applied to the IGBT 20 at the breakdown voltage of the diode 30. By the associated increase of the gate voltage of the IGBT 20, the IGBT 20 is then turned on in the same way as in FIG. 7(a). When the overvoltage vanishes, the IGBT 20 is turned off.

In FIGS. 7(a) and 7(b), it is more advantageous to build the protective diode 30 in the chip of the transistor to be protected than to install the diode 30 externally. This invention relates to the built-in protective diode. FIG. 8 is a sectional view illustrating a conventional built-in protective diode 30. The FET 10 in FIG. 8(a) and the IGBT 20 in FIG. 8(b) are the object to be protected.

The chip of the FET 10 shown in FIG. 8(a) is obtained by growing an n-type epitaxial layer as a semiconductor region 2 on an n-type substrate 1. The FET 10 is built in vertically to the semiconductor region 2 by repeatedly accumulating the structure units as shown on the right hand side of the figure. The FET 10 comprises a gate 11 disposed on an oxide gate film 11a, a p-type base layer 12, and an n-type source layer 13. The source terminal S is led out from an electrode film 14 in electrical contact with the base layer 12 and the source layer 13; the drain terminal D is led out from a back electrode film 15 in electrical contact with the substrate 1; and the gate terminal G is led out from the gate 11. The protective diode 30 comprises a p-type diode layer 32 formed by diffusion from the surface area of the semiconductor region 2 surrounded by an insulation film 31; and a diode terminal A led out from an electrode film 34 disposed on the diode layers 32. The supplementary diode 50 is connected between the diode terminal A and the gate terminal G of the FET 10.

The IGBT 20 of FIG. 8(b) differs from the FET 10 of FIG. 8(a) in that the chip is formed by diffusing an n-type buffer layer 1a on the p-type substrate 1 and then epitaxially growing the n-type semiconductor region 2 on the buffer layer 1a. However, the IGBT 20 in FIG. 8(b) is formed underneath the surface of the semiconductor region 2 in the same way as the FET 10 in FIG. 8(a) and the protective diodes 30 in both FIGS. 8(a) and 8(b) have the same structure. As shown these figures, the protective diode 30 is built in the semiconductor region 2 into which a depletion layer spreads while the FET 10 or the IGBT 20 is turned off. The supplementary diode 50 in FIG. 8(a) is formed in a region on the substrate not shown in the figure by employing polycrystalline silicon for the gate 11.

A transistor can be protected from overvoltage by building the protective diode 30 in a common chip with the FET 10 or the IGBT 20, without employing any external connections. However, this configuration usually requires the breakdown voltage of the protective diode 30 to be set accurately by 50 to 100 V lower than the withstand voltage value of the transistor to be protected. In addition, it takes a considerably long time to diffuse in the diode layer 32, the diffusion depth of which is not controlled easily.

Though the diode layer 32 is built in by diffusion from the surface of the semiconductor region 2, an epitaxial layer such as the semiconductor region 2 is grown to a thickness thick enough and its resistivity high enough to facilitate expansion of the depletion layer while the FET 10 or the IGBT 20 is OFF. Therefore, the breakdown voltage of the protective diode 30 cannot be reduced to a desired value without diffusing in the diode layer 32 deeply. It takes as long as 20 to 30 hours in diffusing in the deep enough diode layer 32 even at temperatures as high as 1,100 degrees centigrade, which causes financial and industrial disadvantages. The diffusion depth precision is deteriorated by long periods of heating. In addition to this, the diode layer 32 is subject to deformation by the high temperature in-diffusion of the base layer 12 of the FET 10 or the IGBT 20, which causes undesirable distribution of the breakdown voltage. In view of these problem, an object of the present invention is to provide a protective diode that is built easily in a chip of a transistor to be protected and shows an accurate breakdown voltage.

SUMMARY OF THE INVENTION

According to the present invention, the above object is achieved by a protective diode for a transistor, built in a chip of the transistor to be protected, that comprises a plurality diode layers, formed by diffusion from the surface of a semiconductor region into which depletion layers spread when the transistor is turned off, of opposite conduction type to that of the semiconductor region; an insulation film that commonly covers the diode layers; an electrode film that is in electrical contact with the diode layers through windows formed through the insulation film; and a diode terminal led out from the electrode film and connected to the transistor.

The spacing among the diode layers depends upon the resistivity of the semiconductor region, but it should be 10 μm or more as far as the resistivity remains within the normal range. In order to further decrease the breakdown voltage of the protective diode, a plurality of counter-doped layers are formed among the diode layers by diffusing impurities, of the same conduction type with the semiconductor region but with higher concentration than in the semiconductor region, in the surface layer of the semiconductor region among the diode layers.

The object of the present invention is also achieved by a protective diode for a transistor, built in a chip of the transistor to be protected, that comprises a plurality of diode layers, formed by diffusion from the surface of a semiconductor region into which depletion layers spread when the transistor is turned off, of opposite conduction type to that of the semiconductor region; an insulation film that commonly covers the diode layers; a plurality of electrode films each of which is in electrical contact with each of the diode layers through a window formed through the insulation film; and a diode terminal led out from the electrode film and connected to the transistor.

The object of the present invention is also achieved by a built in protective diode in a transistor chip that comprises a diode layer, formed by diffusion from the surface of a semiconductor region, of opposite conduction type to that of the semiconductor region; an insulation film that covers the surface of the semiconductor region on the peripheral area of the diode layer and on the area surrounding the peripheral area; an electrode film that is in electrical contact with the diode layer; and a diode terminal led out from the electrode film and connected to the transistor. The impurity concentration in the diode layer depends on the resistivity of the semiconductor region, but the surface impurity concentration should be $10^{17}$ atom/cm$^3$ or less when the resistivity of the semiconductor region is within a normal range.

The object of the present invention is achieved also by a protective diode for a transistor that comprises the first diode layer, formed by diffusion from the surface of a semiconductor region, of same conduction type with that of the semiconductor region; the second diode layer, formed by diffusion from the surface of the semiconductor region over the first diode layer, of opposite conduction type to that of the semiconductor region; and an insulation film that is in electrical contact with the second diode layer. A diode terminal led out from the electrode film is connected to the transistor.

A protective diode for protecting an insulated gate transistor according to the present invention comprises a diode connection transistor, built in from a surface of a semiconductor region into which a depletion layer spreads, having same structure with the insulated gate transistor except its shorter channel length than that of the insulated gate transistor; and a diode connection terminal of the diode connection transistor connected to the insulated gate transistor.

The plurality of diode layers separated from each other provide areas from which a plurality of depletion layers spread into the semiconductor region and prevent the depletion layers from joining with each other. The counter-doped layers disposed among the diode layers effectively prevents the depletion layers from joining with each other. In the protective diode that comprises an insulation film that covers the surface of the semiconductor region on the peripheral area of the diode layer and on the area surrounding the peripheral area, the depletion layer spreads into the diode layer as well as into the semiconductor region to enhance punching through on the under surface of the insulation film. In the protective diode that comprises the first and the second diode layers, the flat semiconductor junction between the first and the second diode layers enhances Zener breakdown. The protective diode for an insulated gate transistor, in which a diode connection is employed, has a same structure except its shorter channel length and a lower breakdown voltage than the insulated gate transistor to be protected. In either protective diode, the impurities are diffused in by one order of magnitude shallower than in the prior art. The much shallower impurity diffusion depth makes it possible to easily obtain a protective diode with a desired breakdown voltage lower than the withstand voltage of the transistor to be protected.

BRIEF DESCRIPTION OF THE DRAWINGS

FIG. 7 shows circuit diagrams illustrating connection of a protective diode to a transistor to be protected, in which FIG. 8 is a cross sectional view of the conventional protective diode built in a chip of a transistor to be protected, in which

DETAILED DESCRIPTION OF THE PREFERRED EMBODIMENTS

Figure 7A:
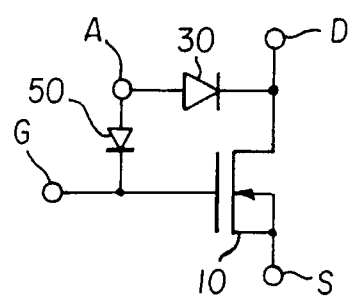
FIG. 7(a) shows a circuit for the protection of an FET and FIG. 7(b) shows a circuit for the protection of an IGBT.
Figure 7B:
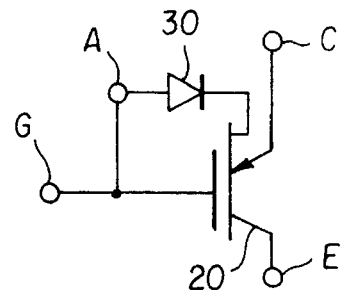
Figure 8A:
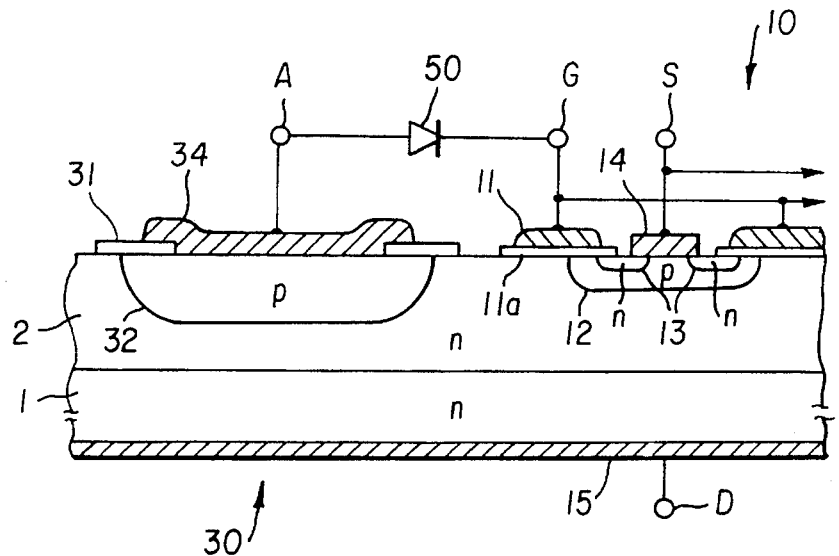
FIG. 8(a) shows an example of the FET protection and FIG. 8(b) shows an example of the IGBT protection.
Figure 8B:
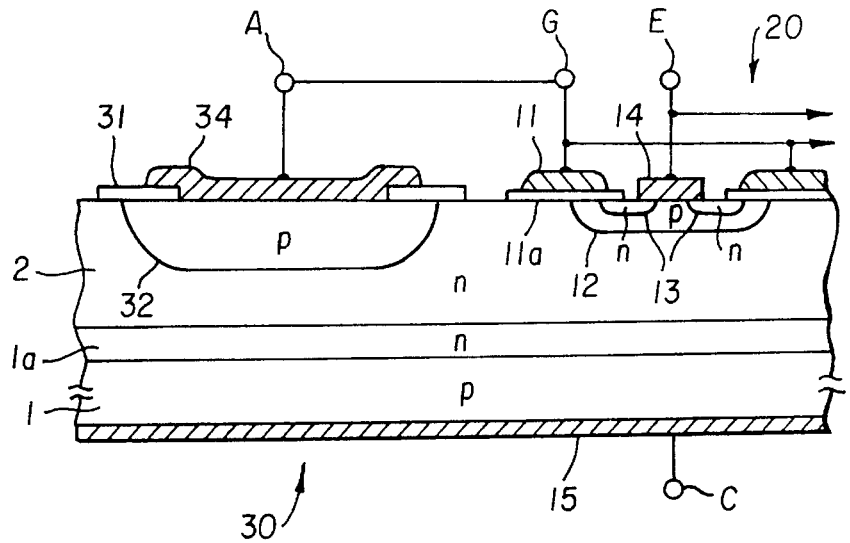

The embodiments of the present invention are described with reference to FIGS. 1 to 6. The same parts with those in FIGS. 7 and 8 are designated by the same reference numerals or symbols, and the description of such parts is omitted for simplicity. In the embodiments described below, the FET 10 corresponding to the equivalent circuit in FIG. 7(a) is chosen as the protection object, though the protective diode according to the present invention is applicable to the protection of various transistors including the IGBT 20 in FIG. 7(b).

Figure 1:
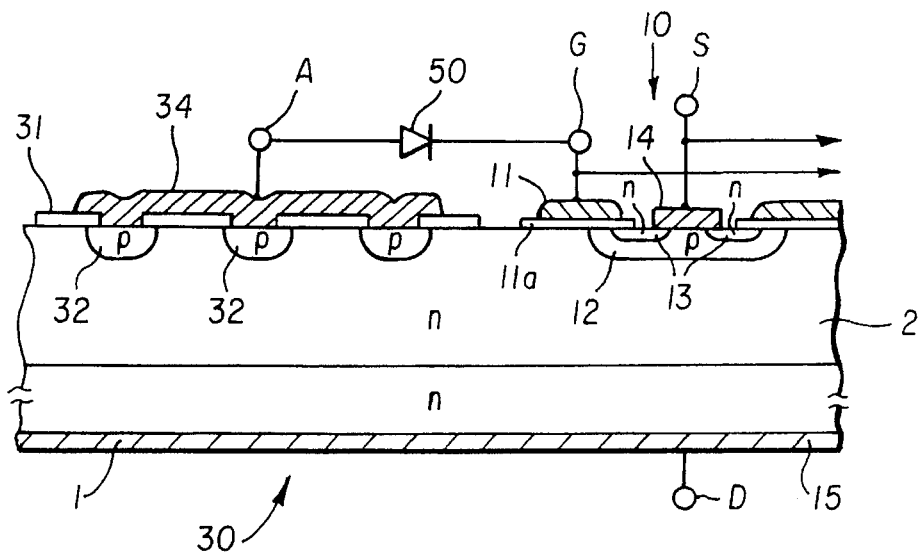
FIG. 1 is a cross sectional view illustrating the first embodiment of the protective diode for a transistor according to the present invention.

In FIG. 1, the transistor to be protected is an FET having the same structure units as in FIG. 8. The semiconductor region 2, an n-type epitaxial layer in the chip in which the transistor 10 is built, is formed to have a thickness of 30 to 50 μm and to have an impurity concentration of for example, $10^{13}$ atom/cm$^3$ so as to obtain the desired withstand voltage. For example, the FET 10 has a withstand voltage of 800 V and a current capacity of from several to ten-odd ampere. In this vertical FET 10, a depletion layer spreads from the base layer 12 to the semiconductor areas 2 while FET 10 is OFF, as is well known. The overvoltage applied to the drain terminal D in FIG. 7(a) substantially exceeds the withstand voltage and reaches, as an example, beyond 900 V. In order to protect the FET 10 from such overvoltage, the breakdown voltage of the protective diode 30 is usually set at 700 to 750 V, a value lower by 50 to 100 V than the corresponding withstand voltage.

The protective diode 30 in the embodiment in FIG. 1 is formed by providing an insulation film 31 on the surface of the n-type semiconductor region 2; forming a plurality of windows through the film 31 by the photo process; forming a plurality of diode layers 32 by ion implantation of p-type impurities through the windows and thermal diffusion of the implanted impurities; and disposing as a diode terminal A an aluminum electrode film 34 that is in common electrical contact with the diode layers 32. In correspondence to FIG. 7(b), this diode terminal A is connected to the gate terminal G via the supplementary diode 50. For example, the diode layers 32, with the surface impurity concentration of $10^{19}$ atom/cm$^3$, is diffused in to a depth of 2 to 3 μm. It is advantageous to form the diode layers 32 and the base layer 12 by the simultaneous diffusion for the convenience of the process. It is preferable to employ from three to several diode layers 32 as shown in FIG. 1. It is also preferable to build in the supplementary diode 50 in a region other than the cross section shown in FIG. 1, by employing polycrystalline silicon of which the gate 11 of the FET 10 is made.

As described above, a depletion layer spreads from each diode layers 32 into the semiconductor region 2 while the FET 10 is OFF. Since avalanche breakdown starts from the part where electric field is most concentrated, which corresponds to the corner in the bottom of the diode layer 32 when over voltage is applied to the drain terminal D. The conventional single-diode layer 32 of FIG. 8(a) requires a diffusion depth of 15 to 20 μm. However, the protective diode 30 in the first embodiment sufficiently reduces the breakdown voltage in the diode layer 32 with a diffusion depth of one-half to one-tenth of the conventional depth. In order to enhance such an effect, it is preferable to minimize the spread of the depletion layers from adjacent diode layers 32 and to suppress concentration of electric field in the curved part of the diode layers 32. Therefore, the spacing among the plurality of diode layers 32 should preferably be set at more than 10 μm or more than 20 μm for the high withstand voltage FET 20.

Figure 2:
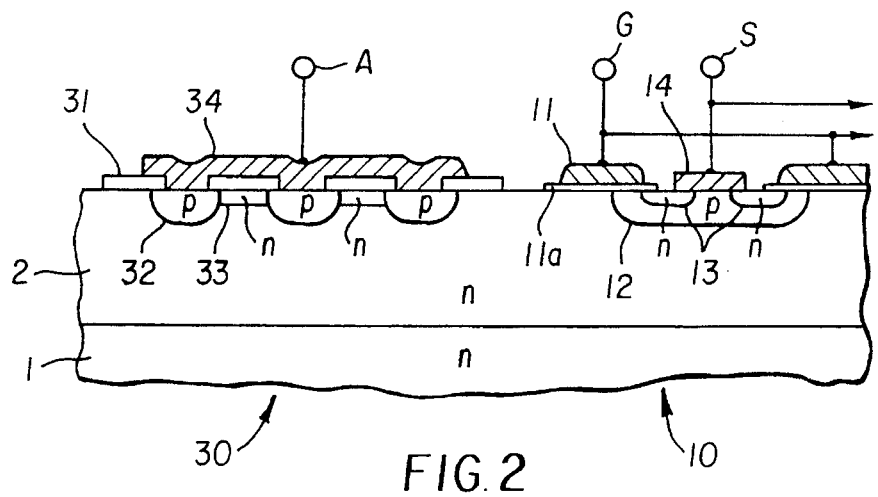
FIG. 2 is a cross sectional view illustrating the preferable modification of the first embodiment of the protective diode for a transistor according to the present invention.

FIG. 2 is a cross sectional view showing a preferable modification of the embodiment of FIG. 1. In FIG. 2, an n-type counter-doped layer 33 with higher impurity concentration than the semiconductor region 2 is formed by diffusion among the diode layers 32 beneath the surface the semiconductor region 2. The preferable impurity concentration in the counter-doped layer 33 is one order of magnitude higher than that in the semiconductor region 2, for example, $10^{14}$ atom/cm$^3$. The diffusion depth of the counter-doped layer 33 should preferably be very shallow, that is around 1 to 2 μm. In the embodiment in FIG. 1, when the FET is OFF, depletion layers spread also along the surface of the semiconductor region 2 underneath the insulation film 31 among the diode layers 32, while in FIG. 2, the counter-doped layers 33 inhibit the transverse elongation of the depletion layers. Thus the counter-doped layers 33 prevent the depletion layers, extending from adjacent diode layers, from joining with each other and further reduces the breakdown voltage of the protective diode 30. The counter-doped layers 33 shorten the spacings among the diode layers 32 when the breakdown voltage need not be reduced.

Figure 3:
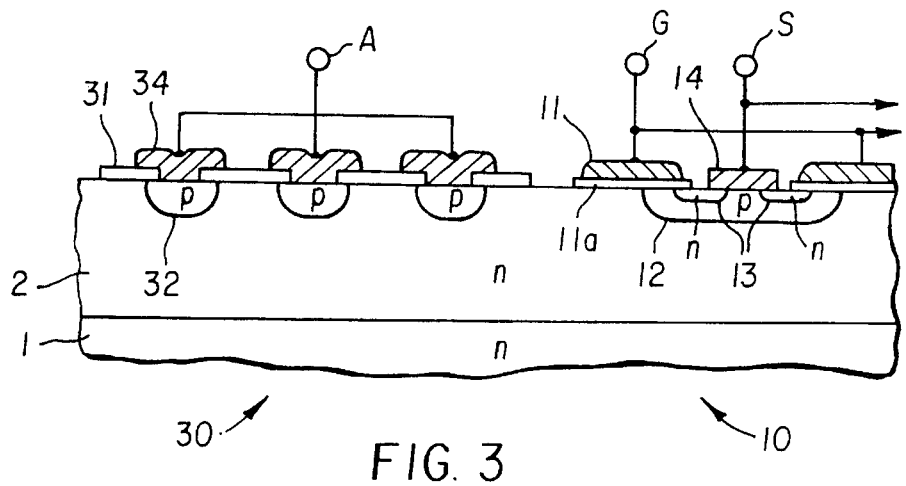
FIG. 3 is a cross sectional view illustrating the second embodiment of the protective diode for a transistor according to the present invention.

FIG. 3 shows the second embodiment of the present invention. In this embodiment, the electrode films 34 are disposed on the diode layers 32 so that the electrode films 34 are separated from each other on the insulation film 31 among the diode layers 32, and the common diode terminal A is connected to the electrode films 34. The electrode films 34 on the insulation film 31 serve as a field plate that causes electrostatic induction to the corresponding surface area of the semiconductor region 2 and increases breakdown voltage of the protective diode 30. Therefore the electrode films 34 with enough spacing to each other on the insulation film 31 of this embodiment kills the field plate effect and contribute to the reduction of breakdown voltage of the protective diode 30 more effectively than the embodiment of FIG. 1, or narrows the spacings among the diode layers 32 when the break down voltage may remain constant.

Figure 4:
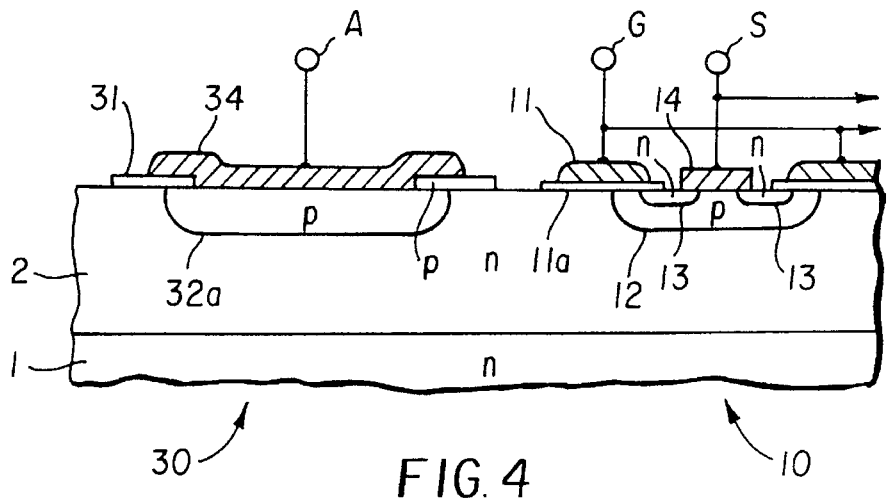
FIG. 4 is a cross sectional view illustrating the third embodiment of the protective diode for a transistor according to the present invention.

FIG. 4 shows the third embodiment of the present invention. In this embodiment, a diode layer 32 with relatively low impurity concentration is built in by in-diffusion through the windows of an insulation film 31 that covers the surface of the semiconductor region 2, and a diode terminal A is led out from the electrode film 34 that is in electrical contact with the diode layer 32. The impurity concentration in the diode layer 32 should be $10^{17}$ atom/cm$^3$ or less, and preferably $10^{16}$ atom/cm$^3$. The periphery of the diode layer 32 is extended under the insulation film 31 by up to several μm depending on the desired breakdown voltage. In this protective diode 30, a depletion layer spreads, when overvoltage is applied, not only into the semiconductor region 2 but also into the diode layer 32 to enhance punch-through on the under surface of the insulation film 31 as shown by P in the figure. In this embodiment, the impurity concentration of diode layer 32 and extension length of the layer 32 under the insulation film 31 facilitates setting breakdown voltage by the punch-through at a desired value lower than the withstand voltage of the FET 10.

Figure 5:
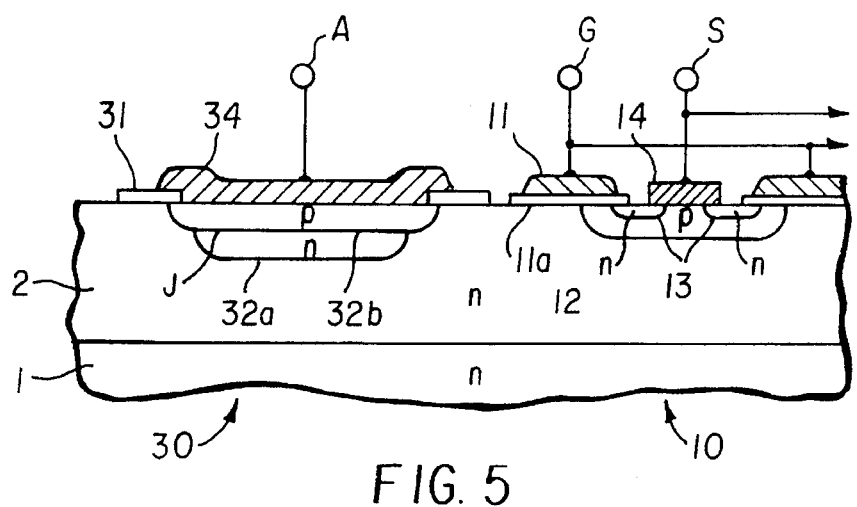
FIG. 5 is a cross sectional view illustrating the fourth embodiment of the protective diode for a transistor according to the present invention.

FIG. 5 shows a fourth embodiment of the present invention. In this embodiment, the first diode layer 32a with an impurity concentration of $10^{14}$ to $10^{15}$ atom/cm$^3$, for example, is built in at first by in-diffusion to a somewhat deeper depth of 5 μm from the surface of the semiconductor region 2. The conduction type of the first diode layer 32a is same n-type with that of the semiconductor region 2. The p-type second diode layer 32b with an impurity concentration of, for example, $10^{17}$ to $10^{18}$ atom/cm$^3$, is then formed by in-diffusion to a depth of 2 to 3 μm over the first diode layer 32a so that the second diode layer 32b may extend to the outside area surrounding the first diode layer 32a as shown in FIG. 5. The diode terminal A is led out from the electrode film 34 that is in electrical contact with the second diode layer 32b. Through the flat pn junction thus formed between both diode layers 32a and 32b, a Zener breakdown occurs when overvoltage is applied to the protective diode 30. In this embodiment, the breakdown voltage is set at a desired value through the Zener voltage by selecting the impurity concentration of both diode layers 32a and 32b. Therefore, this embodiment is advantageous for saving the chip area into which the protective diode 30 is built.

Figure 6:
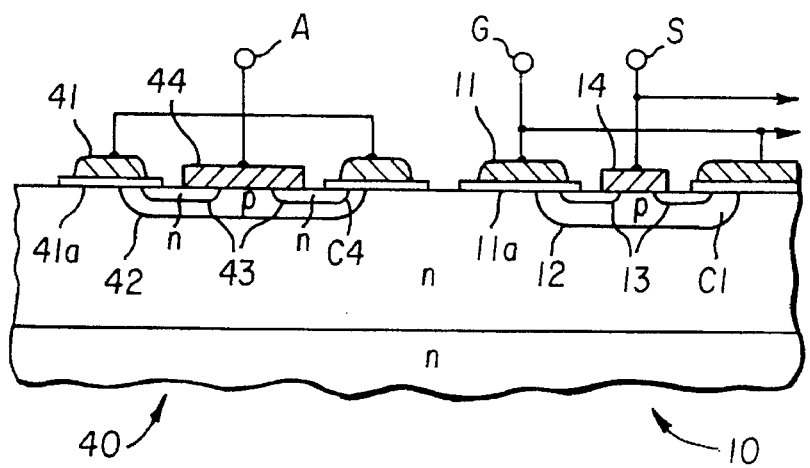
FIG. 6 is a cross sectional view illustrating the fifth embodiment of the protective diode for a transistor according to the present invention.

FIG. 6 shows the fifth embodiment of the present invention. In this embodiment, a protective diode 40 has a same structure with the FET 10 to be protected. The protective diode 40 comprises a gate 41; an oxide gate film 41a; a base layer 42; a source layer 43; and an electrode film 44. The protective diode 40 is built in underneath the semiconductor region 2 so that the diode 40 has a channel length C4 shorter than the channel length C1 of the FET 10. The gate 41 and the electrode 44 are coupled by diode connection. A diode terminal A is then led out from the diode connection as shown in the figure. This diode-connected transistor with a shorter channel length naturally has withstand voltage lower than that of the FET 10. For ensuring the breakdown of this transistor, when overvoltage is applied, at the desired voltage lower than the withstand voltage of the FET 10, the channel length C4 is set preferably, for example, within 1.5 to 3 μm with respect to the 3 to 5 μm channel length of the FET 10.

In the fifth embodiment, the base layer 42 should be formed by a different diffusion process from that for the formation of the base layer of the FET 10. However, since all other parts are formed through the same processes as the FET 10, the chip area occupied by the protective diode 40 is considerably reduced.

Since the first to fifth embodiments explained above with reference to FIGS. 1 to 6 differ only in the chip structure below the semiconductor region 2, the protective diode 30 or 40 can be built in the semiconductor region 2 in the similar structure by the procedures described above for protecting the IGBT 20 of FIGS. 7(b) and 8(b), except the connection of the diode terminal A to the gate terminal G of the IGBT 20. For protecting other transistors than the FET or the IGBT, a protective diode is useful that has the same structure obtained by the procedures described above, except that the diode terminal should be connected to different part of the transistor depending on the type of the transistor.

In the first and second embodiments, a plurality of diode layers with a conduction type opposite to that of the semiconductor region are formed by the diffusion process from the surface of the semiconductor region into which depletion layers spread when the transistor to be protected is turned off, so that the divided depletion layers may not join with each other easily. The third embodiment spreads the depletion layer also into the diode layer formed underneath the surface of the semiconductor region and enhances punch-through on the under surface of the insulation film in the periphery of the diode layer. The fourth embodiment provides the first diode layer with same conduction type with the semiconductor region as well as the second diode layer formed over the first diode layer with opposite conduction type to the semiconductor region to form a flat pn junction between the first and the second diode layers, and provides Zener breakdown sites. The fifth embodiment provides a diode connection protective transistor having the same structure with the insulated gate transistor to be protected except its shorter channel length. Thus in either embodiment, the impurity diffusion depth is shortened down to one order of magnitude shallower than in the prior art, that makes it possible to easily and economically manufacture a protective diode with the desired breakdown voltage lower than the withstand voltage of the transistor to be protected, the breakdown voltage can be controlled more accurately than in the prior art to safely and reliably protect the transistor to be protected from overvoltage, and (c) the chip area required to build in a protective transistor can be reduced through shallow diffusion, which also prevents transverse diffusion of the dopants.

What is claimed is:

1. A protective diode for a transistor built in a chip of said transistor for protecting said transistor from over-voltage, comprising:

a plurality of diode layers, formed by diffusion from a surface of a semiconductor region into which depletion layers spread when said transistor is "OFF", of opposite conduction type to said semiconductor region;

a common insulation film covering surfaces of said diode layers;

an electrode film in electrical contact with said diode layers through windows formed through said insulation film; and a diode terminal led out from said electrode film and connected to said transistor wherein a breakdown in said diode layers forces said transistor to an "ON" state.

2. The protective diode for a transistor as claimed in claim 1, further comprising a plurality of layers formed from the surface of said semiconductor region between said diode layers by diffusing impurities of the same conduction type but of higher concentration than impurities in said semiconductor region.

3. A protective diode for a transistor built in a chip of said transistor for protecting said transistor from over-voltage, comprising:

a plurality of diode layers, formed by diffusion from a surface of a semiconductor region into which depletion layers spread when said transistor is "OFF", of opposite conduction type to said semiconductor region;

a common insulation film covering surfaces of said diode layers;

a plurality of electrode films in electrical contact with said diode layers through windows formed through said insulation film; and a diode terminal connected to said electrode films and to said transistor wherein a breakdown in said diode layers forces said transistor to an "ON" state.

4. A protective diode for a transistor built in a chip of said transistor for protecting said transistor from over-voltage, comprising:

a diode layer, formed by diffusion from a surface of a semiconductor region into which a depletion layer spreads when said transistor is "OFF", of opposite conduction type to said semiconductor region, wherein an impurity concentration in the diode layer is $10^{17}$ atom/cm$^3$ or less;

an insulation film covering a surface of said semiconductor region on a peripheral area of said diode layer up to several microns and on an area surrounding said peripheral area;

an electrode film in electrical contact with central area of said diode layer and extending over a portion of said insulation film, wherein the electrode film extends past the peripheral area of said diode layer covered by said insulation film such that said entire diode layer is located beneath said electrode film; and a diode terminal led out from said electrode film and connected to said transistor.

5. A protective diode for a transistor built in a chip of said transistor for protecting said transistor from over-voltage, comprising:

a first diode layer, formed by diffusion in a semiconductor region into which a depletion layer spreads when said transistor is "OFF", of same conduction type with said semiconductor region;

a second diode layer, formed by diffusion from a surface of said semiconductor region entirely covering said first diode layer, of opposite conduction type to said semiconductor region;

an electrode film in electrical contact with said second diode layer; and a diode terminal led out from said electrode film and connected to said transistor.

6. An apparatus comprising: a semiconductor substrate;

an insulated gate transistor formed in a first region of the semiconductor substrate having a channel length in the range of 3 to 5 micrometers;

a diode connection transistor built in from a surface of the semiconductor substrate in a region of the substrate into which depletion layers spread when the insulated gate transistor is "OFF";

said diode connection transistor having a first layer of opposite conduction type to said semiconductor region and having a second layer, of the same conduction type to said semiconductor region, diffused into said first layer;

said diode further having a first gate electrode and a second gate electrode and an electrode film located therebetween, wherein said first gate electrode and said second gate electrode are connected, and wherein said electrode film and said first gate electrode and said second gate electrode are coupled by diode connection;

wherein said diode connection transistor has a shorter channel length than said insulated gate transistor;

and wherein a breakdown in said diode connection transistor forces said insulated gate transistor to an "ON" state.

* * * * *